US010809790B2

(12) United States Patent
Gilad et al.

(10) Patent No.: US 10,809,790 B2
(45) Date of Patent: Oct. 20, 2020

(54) DYNAMIC VOLTAGE-LEVEL CLOCK TUNING

(71) Applicant: Intel Corporation, Santa Clara, CA (US)

(72) Inventors: Yiftach Gilad, Givat Ada (IL); Ariel Szapiro, Kfar Neter (IL); Elkana Korem, Tzoran (IL); Alexander Gendler, kiriat motzkin (IL)

(73) Assignee: Intel Corporation, Santa Clara, CA (US)

( * ) Notice: Subject to any disclaimer, the term of this patent is extended or adjusted under 35 U.S.C. 154(b) by 354 days.

(21) Appl. No.: 15/638,573

(22) Filed: Jun. 30, 2017

(65) Prior Publication Data

US 2019/0004583 A1 Jan. 3, 2019

(51) Int. Cl.
| | |
|---|---|
| *G06F 1/32* | (2019.01) |
| *G06F 1/324* | (2019.01) |
| *G06F 1/08* | (2006.01) |
| *G06F 1/3296* | (2019.01) |
| *H03K 5/133* | (2014.01) |
| *H03K 19/003* | (2006.01) |
| *G11C 29/02* | (2006.01) |
| *G11C 7/22* | (2006.01) |
| *G11C 5/14* | (2006.01) |
| *H03K 5/00* | (2006.01) |

(52) U.S. Cl.
CPC .............. *G06F 1/324* (2013.01); *G06F 1/08* (2013.01); *G06F 1/3296* (2013.01); *G11C 29/023* (2013.01); *G11C 29/028* (2013.01); *H03K 5/133* (2013.01); *H03K 19/00323* (2013.01); *G11C 5/14* (2013.01); *G11C 7/222* (2013.01); *H03K 2005/00019* (2013.01)

(58) Field of Classification Search
CPC ..... G06F 1/32; G06F 1/26; G06F 1/28; G06F 9/44
See application file for complete search history.

(56) References Cited

U.S. PATENT DOCUMENTS

| | | | | |
|---|---|---|---|---|
| 2001/0028599 | A1* | 10/2001 | Aikawa | G11C 7/1066 365/233.12 |
| 2003/0058052 | A1* | 3/2003 | Birk | G06F 1/04 331/1 A |
| 2004/0255176 | A1* | 12/2004 | George | G06F 1/3203 713/320 |

(Continued)

*Primary Examiner* — Keshab R Pandey
(74) *Attorney, Agent, or Firm* — Schwegman Lundberg & Woessner, P.A.

(57) ABSTRACT

Apparatus and methods are provided for improving yield and frequency performance of integrated circuit processors, such as multiple-core processors. In an example, an apparatus can include a plurality of clock buffers, each clock buffer of the plurality of clock buffers configured to receive a first clock signal and distribute a plurality of second clock signals, a one-time programmable locate critical path mechanism configured provide a plurality of indications to enable or disable a delay of each clock buffer of the plurality of clock buffers, and a power management control circuit configured to over-ride one or more of the plurality of indications in a first non-test mode of operation of the apparatus and to not over-ride the one or more indications in a second non-test mode of operation of the apparatus.

18 Claims, 4 Drawing Sheets

(56) References Cited

U.S. PATENT DOCUMENTS

| | | | | |
|---|---|---|---|---|
| 2006/0076972 A1* | 4/2006 | Walker | ............... | G01R 31/2642 |
| | | | | 324/762.09 |
| 2008/0204158 A1* | 8/2008 | Weder | ................... | H03K 3/0315 |
| | | | | 331/177 V |
| 2009/0083600 A1* | 3/2009 | Rahman | ................. | G06F 11/261 |
| | | | | 714/741 |
| 2012/0158339 A1* | 6/2012 | Chawla | ............... | G06F 11/3024 |
| | | | | 702/89 |
| 2012/0249199 A1* | 10/2012 | Chung | ................... | H03L 7/0812 |
| | | | | 327/158 |
| 2013/0041608 A1* | 2/2013 | Charlebois | .......... | G06F 17/5031 |
| | | | | 702/79 |

\* cited by examiner

DYNAMIC VOLTAGE-LEVEL CLOCK TUNING

TECHNICAL FIELD

The disclosure herein relates generally to integrated processors and more particularly to speed improvements to compensate for small structural differences of otherwise identical semiconductor devices.

BACKGROUND

As semiconductor electronics have evolved, increasing speed, reducing size, and conserving power have become some of the busiest areas of developmental focus. Incremental innovation, in each area, can hold promise of capturing, at least for a while, marketplace advantage over competitors. Multi-core processors can rely on synchronization of sequential logic circuits to provide top-end processing speed. Testing and calibration can make use of distributed clock delays to compensate for micro-structural manufacturing differences between otherwise identical devices that limit top-end speed synchronization. However, using the delays to achieve top-end optimization can reduce the yield of cores. In certain situations, although the added delays improve high frequency performance, the added delays can prohibit acceptable operation during low-speed/low voltage operation.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings in which.

DETAILED DESCRIPTION

Figure 1:
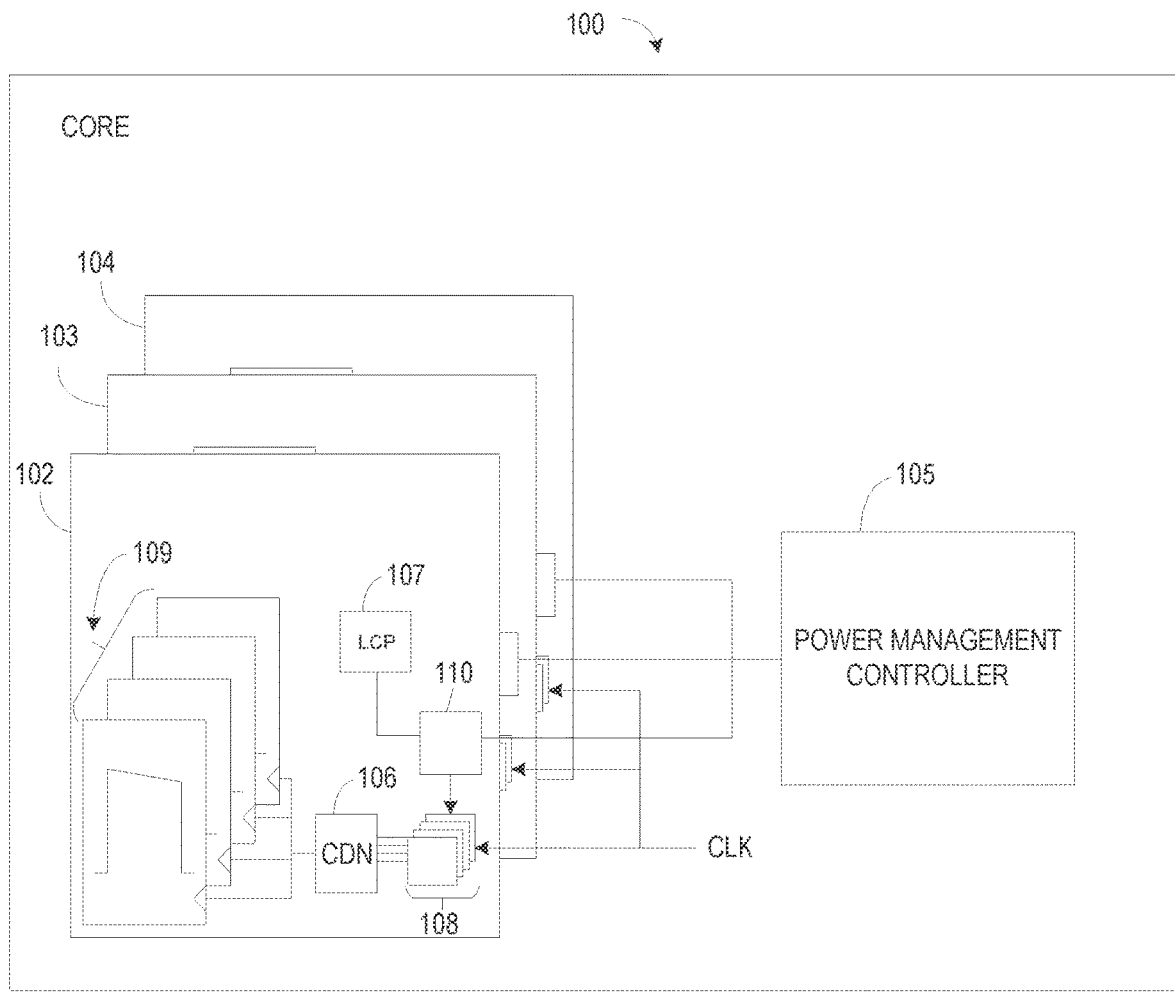
FIG. 1 illustrates generally a block diagram of an example core of an integrated circuit processor.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Each wafer of processor silicon units that returns from manufacturing or fabrication goes through a sorting and classification process or mechanism and also through quality checks (QNR) before being sent to component debug (CD) for timing analysis. During the sorting mechanism, damaged units can be being filtered out and the remaining units are distributed to different groups according to the nature of their silicon characteristics (e.g., fast/slow material, more/less leaky material, etc.). Component debug (CD) can be responsible for detecting the worse timing paths, detecting root cause of such timing paths and communicating such findings to the design team to implement fixes in the next design step/dash. A conventional mechanism to investigate the root cause for timing limiters (e.g. worst timing paths which limit the maximal operative frequency of the CPU) is a located critical paths (LCP) mechanism. The timing paths in synchronic design can include sequential elements which sample data and synchronize data. The nature of the timing path is primarily guided by the interaction between one sequential element that generates or passes data to another sequential element that receives or samples the data. The concept of a fused locate critical path (FLCP) mechanism is based on the idea that by delaying the clocks of the sampling elements, the worse timing paths between the sampling elements can be revealed. For example, delaying the clock of a generating element can lead to frequency drop, while delaying the clock of a sampling element can lead to frequency improvement. Delaying the clocks one by one can reveal both generating and sampling elements of the frequency limiter and can hint at the possible root cause of a frequency limitation.

Core design can include many clock elements which are called regional clock buffers (RCBs). RCBs can enable the manipulation of a clock network delay in component debug. The output of an RCB can be the functional clock of multiple sequential elements. RCB inputs can include the functional clock from the Spine/PLL of the core and, optionally, control signals driven by an LCP mechanism. The control signals can command the RCB to apply a clock delay on a particular edge (rise or fall) of the clock signal. Each sequential element can be controlled by a clock network which starts with one of the RCB elements, thus can be later manipulated by the LCP mechanism. Traditional LCP mechanisms are only available for testability in CD, thus, once a root cause is identified, the cores need to be reprocessed. FLCP mechanism represent an improvement tp convention LCP mechanism. Contrary to traditional LCP mechanisms, the the FLCP can fix the clock manipulation on sampling elements for functional or non-testing operation. FLCP mechanisms can lead to frequency improvement of cores in production. FLCP mechanisms are aimed to be used during the production release step in order to solve big frequency outliers, however, FLCP may also be used between steps in order to help with the debug process.

However, although FLCP can reduce reprocessing and increase initial yields, FLCP can also introduce min delay issues. Such minimum delay issues can include a scenario in which data from the next cycle is mistakenly sampled in the current cycle due to a FLCP delayed clock. As explained before, each LCP controller practically delays multiple clocks which are connected to multiple sequential elements, thus although it improves frequency for the limiter path, it can also increases the chance for minimum delay problems on other paths. Minimum delay problem is reflected in yield impact as well as minimum supply poser increase. In low voltage levels, the minimum delay impact can be greater and can be compensated for by operating the core at a higher minimum voltage, which can have an undesired or negative impact on the power requirement of the CPU FIG. 1 illustrates generally a block diagram of an example core 100 of an integrated circuit processor. In certain examples, the core 100 can include an improved clock distribution techniques that allow for improved performance and fabrication yield over prior clock distribution techniques. In certain examples, the core 100 can include one or more functional unit blocks (FUBs) 102, 103, 104, and an example power management control circuit 105. The power management control circuit 105 can receive voltage and frequency information from the core, as well as, voltage and frequency information for the FUBs 102, 103, 104, and can influence delay settings associated with clock distribution networks 106 of each FUB.

A functional unit block (FUB) 102, 103, 104 can be designed to perform a particular processing task. Such functional unit blocks 102, 103, 104 can include, but are not limited to, an individual adder, a decoder, a cache, etc. In certain examples, a FUB 102 can include a locate critical path (LCP) controller 107, one or more regional clock buffers (RCBs) 108, and a plurality of sequential logic circuits 109, or sequential logic circuit devices, configured to receive an output of at least one of the RCBs 108. Within the FUB 102, sequential logic circuits 109 can work in parallel to generate and sample data. Synchronization of such functions allows the FUBs 102, 103, 104 to work together within the core 100.

As discussed above, the LCP controller 107 can be activated during wafer testing. In certain examples, the LCP controller 107 is activated when the core 100 is being sorted into performance classes. The LCP controller 107 can assist in locating frequency limiting paths of the FUBs 102, 103, 104 and can assist in configuring clock delays in cooperation with the regional clock buffers (RCBs) 108 to identity high frequency limits and ultimately improve high frequency performance of the FUBs 102, 103, 104 and the core 100.

RCBs 108 can allow manipulation on the clock network 106. An output of an RCB 108 can be the functional clock of multiple sequential elements 109 of a FUB 102. Each RCB 108 can receive a clock signal (CLK) from a spine or phase-locked loop (PLL) of the core 100. In certain examples, an RCB 108 can also receive control signals from the LCP controller 107 that can command that a delay be applied to either a rising edge of the RCB output or the trailing edge of the RCB output. In certain examples, a clock buffer, such as a regional clock buffer, can include one or more logical gates such as, but not limited to, an AND gate, an OR gate, or combinations thereof. In certain examples, enabling or disabling one or more of the logical gates can provide a desired delay to improve high frequency performance of at least a portion of the sequential logic circuits 109

In certain examples, an RCB 108 can receive a clock signal (CLK) of the core 100, and can re-distribute the clock signal to one or more sequential logic circuits 109 of the FUB 102. Each sequential logic circuit 109 can be controlled by a clock distribution network 106 which starts with one of the RCB elements 108, thus, can be manipulated, during testing of the core 100, by the LCP mechanism. During class sorting of the cores 100, the LCP controllers 107 can test and set delays of the RCBs 108 to optimize frequency-type performance of the FUB 102, 103, 104 locally and of the core 100 in general. Once the delays are set, the LCP controllers 107 can be disabled and the RCB delays can become fixed when the LCP controller 109 is implemented with a FLCP mechanism. The sequential logic circuits 109 can receive a clock signal from an RCB 108 and can perform the tasks required of the FUB 102. Although the sequential logic circuits 109 have been optimized to provide the best high-frequency performance via the delays introduced with the LCP controller 107, those delays can render some sequential logic circuits 109 unfit for use because the delays do not allow the core 100 to function robustly within low-frequency performance requirements.

In certain examples, the FUB 102 can include a delay controller circuit 110 and the delay controller circuit 110 can receive power management information from the power management control circuit 105 of the core 100. The delay controller circuit 110 can use the power management information to alter or interrupt the delay settings fixed by the LCP controller 107 for one or more RCBs 108 of the FUB 102. Such an improvement can allow certain clock domains, such as ones that used clock delays to improve high frequency operation, to eliminate the clock delays such that low frequency operation can meet desired performance thresholds, also.

Figure 2:
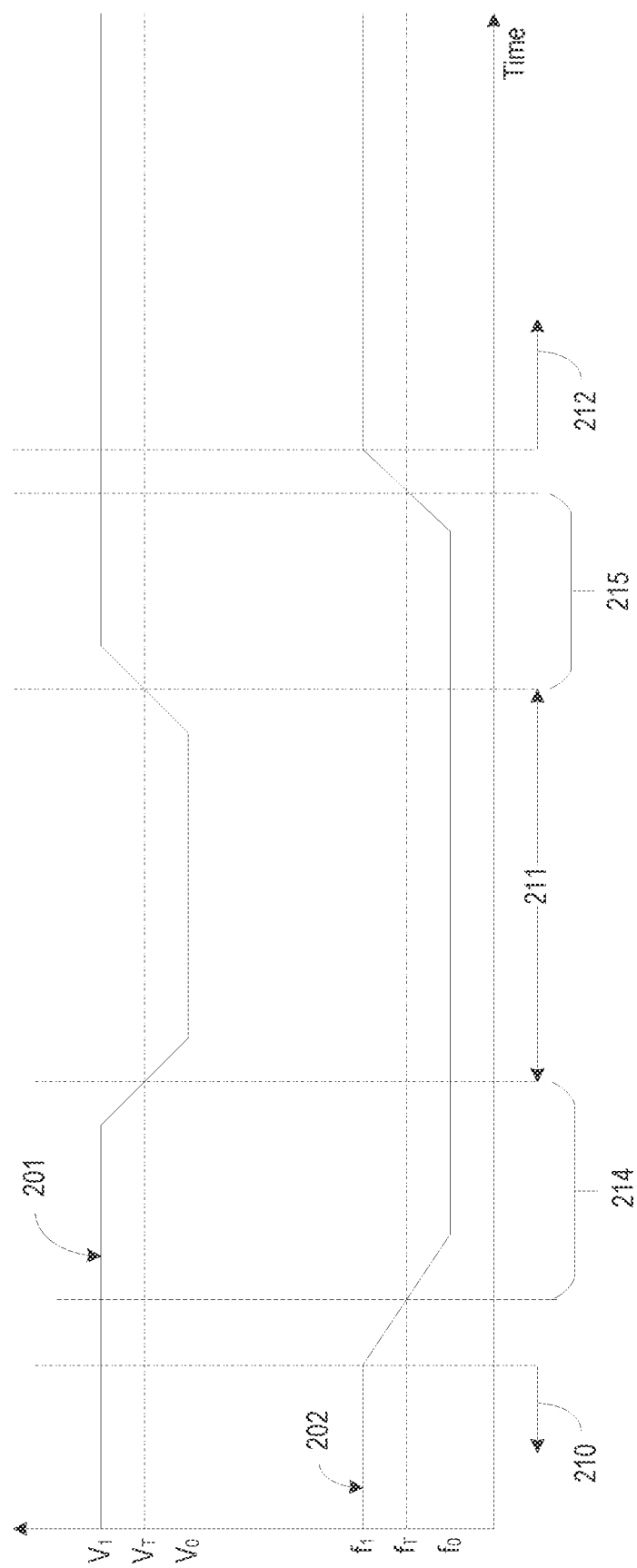
FIG. 2 illustrates generally voltage and frequency signal plots of an example core with an improved clock distribution mechanism that can improve performance and yield of cores over conventional LCP and FLCP techniques without reprocessing the cores when frequency limiters are identified.

FIG. 2 illustrates generally voltage and frequency signal plots 201, 202 of an example core with an improved clock distribution mechanism that can improve performance and yield of cores over conventional LCP and FLCP techniques without reprocessing the cores when frequency limiters are identified. In certain examples, multi-core processors are capable of adjusting operating conditions, or power flows of the cores. Likewise, the cores can include a power management control circuit to control transitions of the core and the FUBs between power flows. In certain examples, the power management control circuit can create a safe zone 203, 204 for transitioning or over-riding the delays set by the LCP controller or the FLCP controller. Such safe zones can be characterized by high supply voltage and low operating frequency of the FUB. In such safe zones of operation, if the LCP delays are disabled, any speed limiting paths will not be exposed because the frequency is lower than a frequency threshold ($f_T$) that can be significantly lower than a known, robust, maximum operating frequency. In addition, if the LCP delays are enabled, low-speed minimum supply voltage issues will not be exposed because the power management control circuit can command that the supply voltage be maintained above a voltage threshold ($V_T$). Referring again to FIG. 2, the signal plots 201, 202 illustrate a core or a FUB transitioning from a high performance mode of operation 210 to a lower performance mode of operation 211 and then transitioning back to the high performance mode of operation 212. Prior to the transition from the high performance mode of operation 210 to the lower performance mode of operation 211, the supply voltage an be at a first voltage level ($V_1$) above the voltage threshold ($V_T$) and the clock frequency can be at a first frequency ($f_1$). In certain examples, the first frequency ($f_1$) can be a maximum operating frequency of the core. In addition, since the operating frequency of the core is at a high frequency, the delays fixed by the LCP or by the FLCP controller can be enabled to compensate for any frequency limiter paths within the sequential logic.

During the transition from the high performance mode of operation 210 to the lower performance mode of operation 211, the power management controller can command that the supply voltage to the core or the FUB be at the first voltage level ($V_1$) above the voltage threshold ($V_T$) and that the operating frequency be reduced from the first frequency ($f_1$) to a second frequency ($f_1$). In certain examples, the frequency of the core can be commanded to a minimum operating frequency to conserve power. Once the frequency has lowered below the frequency threshold ($f_T$) and during a subsequent safe zone period 215 in which operating frequency remains below the frequency threshold ($f_T$) and the voltage remains above the voltage threshold ($V_T$), the power management system can command that the LCP initiated delays or the FLCP delays be over-rode or disabled. In certain examples, an output of the power management control circuit can trigger a gate coupled to one or more of the RCBs to disable one or more of the LCP or FLCP delays. After the power management control circuit commands that the LCP delays be over-rode, the power management control circuit can command that the supply voltage to the core be lowered to a second voltage level ($V_O$) to further conserve power while the core is operated in a lower performance mode of operation 211. In some examples, a lower performance mode of operation can be a sleep mode of one or more of the cores.

During the transition from the low performance mode of operation 211 to a higher performance mode of operation 212, the clock frequency to the core or the FUB can be commanded by the power management controller to be at a level below the frequency threshold ($f_T$) and the supply voltage to the core can be commanded to be raised beyond the voltage threshold ($V_T$). In certain examples, the supply voltage of the core can be commanded to a level that will not expose any minimum supply voltage issues when the LCP delays are enabled at a low clock frequency. Once the voltage has risen above the voltage threshold ($V_T$) and during a subsequent safe zone period 215 in which operating frequency remains below the frequency threshold ($f_1$), the power management system can command that the LCP initiated delays or the FLCP delays be enabled. In certain examples, an output of the power management control circuit can trigger a gate coupled to one or more of the RCBs to enable the LCP delays. After the power management control circuit commands that the LCP delays be enabled, the power management control circuit can command that the clock frequency to the core be raised to allow the core to provide high performance operations in a high performance mode of operation 212.

In certain examples, use of a power management controller to interrupt the typically fixed high-frequency delay compensation configured with the use of an LCP controller, or an FLCP controller, can allow for higher yields of core circuits that can provide robust performance at both high frequency and low frequency thresholds, where at least one of those performance levels would not have been possible using a traditional LCP controller, where the LCP controller or the output of the LCP controller is not adjustable during non-test operation of the core.

Figure 3:
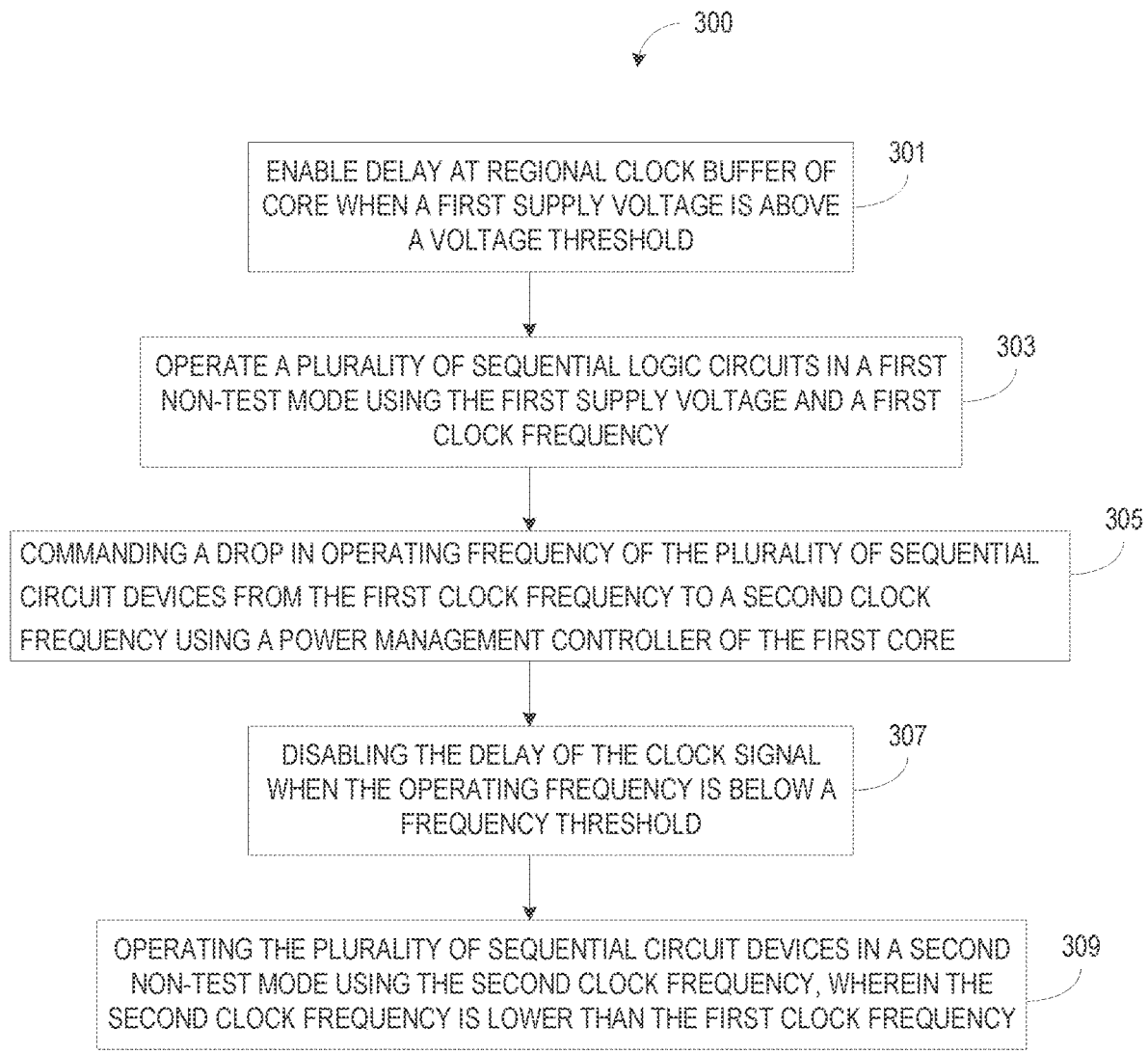
FIG. 3 illustrates generally a flowchart of an example method 300 of operating a processor or a core using an example power management control circuit.

FIG. 3 illustrates generally a flowchart of an example method 300 of operating a processor or a core using an example power management control circuit. At 301, a clock delay can be enabled at regional clock buffer of a core or of a functional unit block of the core in a first power flow, or non-test operating mode of the processor. The first power flow can be characterized by a first supply voltage of the sequential logic circuits of the functional unit block and by a first clock frequency of the functional unit block. In certain examples, a power management controller of the core can control the supply voltage level and the target clock frequency. At 303, the sequential logic circuits can be operated in a high power flow or high performance non-test mode of operation using a supply voltage at a first supply voltage and an operating frequency at a first clock frequency.

At 305, the operating frequency of the sequential logic circuits of the functional unit block can be commanded to be reduced in anticipation of transitioning to a lower power flow or lower performance operating mode of the core. In certain examples the operating frequency, or clock frequency, can be reduced to a second clock frequency. In certain examples, the power management controller of the core can command the reduction in the operating frequency.

At 307, a clock delay associated with a clock signal that drives the sequential logic circuits can be disabled. In certain examples, the clock delay was configured during testing to compensate a frequency limiting data path. In certain examples, a locate critical path (LCP) controller of the core was used to identify the frequency limiting data path. In some examples, a fused locate critical path (FLCP) mechanism was used during testing to fix the delay for post-production or non-test operation. At 305, a power management controller can interrupt or over-ride the fixed delay command to disable the delay, for example, by disabling a delay element of a regional clock buffer of the functional unit block. Disabling the delay can reduce the upper operating speed of the sequential logic circuits, however, since the power management controller has reduced the operating frequency prior to disabling the delay, there is little if any risk of operating the sequential logic too fast.

At 309, the sequential logic circuits can be operated in a low performance or low-power mode using the reduced frequency and a reduced supply voltage. In certain examples, the low power flow can represent a sleep mode of operation of the core.

Figure 4:
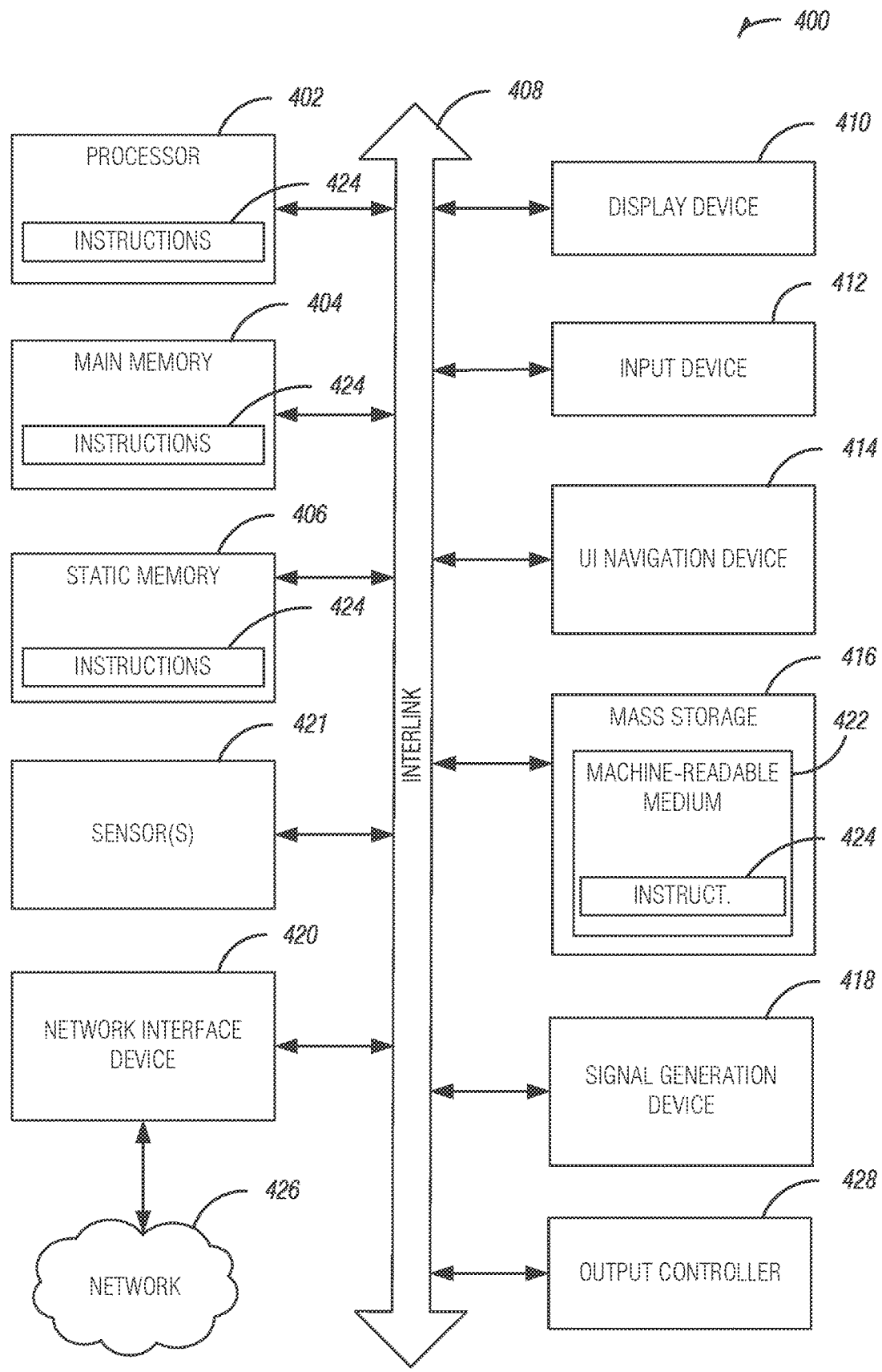
FIG. 4 illustrates a block diagram of an example machine 400 upon which any one or more of the techniques (e.g., methodologies) discussed herein may perform.

FIG. 4 illustrates a block diagram of an example machine 400 upon which any one or more of the techniques (e.g., methodologies) discussed herein may perform. In alternative embodiments, the machine 400 may operate as a standalone device or may be connected (e.g., networked) to other machines. In a networked deployment, the machine 400 may operate in the capacity of a server machine, a client machine, or both in server-client network environments. In an example, the machine 400 may act as a peer machine in peer-to-peer (or other distributed) network environment. As used herein, peer-to-peer refers to a data link directly between two devices (e.g., it is not a hub- and spoke topology). Accordingly, peer-to-peer networking is networking to a set of machines using peer-to-peer data links. The machine 400 may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuit sets are a collection of circuits implemented in tangible entities that include hardware (e.g., simple circuits, gates, logic, etc.). Circuit set membership may be flexible over time and underlying hardware variability. Circuit sets include members that may, alone or in combination, perform specified operations when operating. In an example, hardware of the circuit set may be immutably designed to carry out a specific operation (e.g., hardwired). In an example, the hardware of the circuit set may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuit set in hardware via the variable connections to carry out portions of the specific operation when in operation. Accordingly, the computer readable medium is communicatively coupled to the other components of the circuit set member when the device is operating. In an example, any of the physical components may be used in more than one member of more than one circuit set. For example, under operation, execution units may be used in a first circuit of a first circuit set at one point in time and reused by a second circuit in the first circuit set, or by a third circuit in a second circuit set at a different time.

Machine (e.g., computer system) 400 may include a hardware processor 402 (e.g., a central processing unit (CPU), a graphics processing unit (GPU), a hardware processor core, a multiple-core processor, or any combination thereof), a main memory 404 and a static memory 406, some or all of which may communicate with each other via an interlink (e.g., bus) 408. The machine 400 may further include a display unit 410, an alphanumeric input device 412 (e.g., a keyboard), and a user interface (UI) navigation device 414 (e.g., a mouse). In an example, the display unit 410, input device 412 and UI navigation device 414 may be a touch screen display. The machine 400 may additionally include a storage device (e.g., drive unit) 416, a signal generation device 418 (e.g., a speaker), a network interface device 420, and one or more sensors 421, such as a global positioning system (GPS) sensor, compass, accelerometer, or other sensor. The machine 400 may include an output controller 428, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 416 may include a machine readable medium 422 on which is stored one or more sets of data structures or instructions 424 (e.g., software) embodying or utilized by any one or more of the techniques or functions described herein.

The instructions 424 may also reside, completely or at least partially, within the main memory 404, within static memory 406, or within the hardware processor 402 during execution thereof by the machine 400. In an example, one or any combination of the hardware processor 402, the main memory 404, the static memory 406, or the storage device 416 may constitute machine readable media.

While the machine readable medium 422 is illustrated as a single medium, the term "machine readable medium" may include a single medium or multiple media (e.g., a centralized or distributed database, and/or associated caches and servers) configured to store the one or more instructions 424.

The term "machine readable medium" may include any medium that is capable of storing, encoding, or carrying instructions for execution by the machine 400 and that cause the machine 400 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 424 may further be transmitted or received over a communications network 426 using a transmission medium via the network interface device 420 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®. IEEE 802.16 family of standards known as WiMax®). IEEE 802.15.4 family of standards, peer-to-peer networks, among others. In an example, the network interface device 420 may include one or more physical jacks (e.g., Ethernet, coaxial, or phone jacks) or one or more antennas to connect to the communications network 426. In an example, the network interface device 420 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 400, and includes digital or analog communications signals or other intangible medium to facilitate communication of such software.

Additional Examples and Notes

In Example 1, an apparatus can include a plurality of clock buffers, each clock buffer of the plurality of clock buffers configured to receive a first clock signal and distribute a plurality of second clock signals, a one-time programmable locate critical path mechanism configured provide a plurality of indications to enable or disable a first delay of each clock buffer of the plurality of clock buffers, and a power management control circuit configured to over-ride one or more of the plurality of indications in a first non-test mode of operation of the apparatus and to not over-ride the one or more indications in a second non-test mode of operation of the apparatus.

In Example 2, the one-time programmable locate critical path mechanism of Example 1 optionally is programmed during a test mode of the apparatus.

In Example 3, the first non-test mode of any one or more of Examples 1-2 optionally is defined by a first supply voltage of the apparatus and a first frequency of the first clock signal, and the second non-test mode of any one or more of Examples 1-2 optionally is defined by a second supply voltage of the apparatus and a second frequency of the first clock signal.

In Example 4, the apparatus of any one or more of Examples 1-3 optionally includes a plurality of delay controller circuits, each delay control circuit configured to receive one indication of the plurality of indications and an output of the power management control circuit, and to control one or more delay elements of the plurality of clock buffers based on the one indication and the output of the power management control circuit.

In Example 5, the power management control circuit of any one or more of Examples 1-4 optionally is configured to receive a representation of the supply voltage of the apparatus and a representation of the frequency of the first clock signal, and to provide control information to the plurality of delay controller circuits as the output of the power management control circuit.

In Example 6, the power management control circuit of any one or more of Examples 1-5 optionally includes a first voltage threshold and a first frequency threshold.

In Example 7, during a transition from the first mode to the second mode, the apparatus of any one or more of Examples 1-6 optionally is configured to transition an operating frequency of the apparatus, a first transition of the operating frequency, from the first frequency to the second frequency before transitioning a supply voltage of the apparatus, a first transition of the supply voltage, from the first supply voltage to the second supply voltage, wherein the first frequency is higher than the second frequency.

In Example 8, the power management control circuit of any one or more of Examples 1-7 optionally is configured to detect the first transition of the operating frequency, and to provide first command information to the one or more delay elements before the first transition of the supply voltage.

In Example 9, the one or more delay elements of any one or more of Examples 1-8 optionally are configured to provide a second delay in response to the first command information.

In Example 10, the second delay of any one or more of Examples 1-9 optionally is equivalent to bypassing the one or more delay elements.

In Example 11, during a transition from the second mode to the first mode, the apparatus of any one or more of Examples 1-10 optionally is configured to transition a supply voltage of the apparatus, a second transition of the supply voltage, from the second supply voltage to the first supply voltage before transitioning an operating frequency of the apparatus, a second transition of the operating frequency, from the second frequency to the first frequency.

In Example 12, the power management control circuit of any one or more of Examples 1-11 optionally is configured to detect the second transition of the supply voltage and to provide second command information to the one or more delay elements before the second transition of the operating frequency.

In Example 13, the apparatus of any one or more of Examples 1-12 optionally s a multiple-core processor, and wherein a first core of the multiple-core processor includes the plurality of clock buffers and the one-time programmable locate critical path mechanism.

In Example 14, a method for operating a multiple-core processor can include enabling a delay of a clock signal of a plurality of sequential circuit devices of a first core of the multiple-core processor when a first supply voltage of the plurality of sequential circuit devices is above a threshold, operating the plurality of sequential circuit devices of the first core in a first non-test mode using the first supply voltage and a first clock frequency, commanding a drop in operating frequency of the plurality of sequential circuit devices from the first clock frequency to a second clock frequency using a power management controller of the first core, disabling the delay of the clock signal when the operating frequency is below a frequency threshold, and operating the plurality of sequential circuit devices in a second non-test mode using the second clock frequency, wherein the second clock frequency is lower than the first clock frequency.

In Example 15, the disabling the delay of any one or more of Examples 1-14 optionally includes disabling the delay of the clock signal when the operating frequency is below a frequency threshold using an output of the power management controller.

In Example 16, the method of any one or more of Examples 1-15 optionally includes commanding a drop in a supply voltage of the plurality of sequential circuits from the first supply voltage to a second supply voltage after the delay is disable.

In Example 17, the first supply voltage of any one or more of Examples 1-16 optionally is above a voltage threshold, the voltage threshold indicative of a minimum supply voltage configured to operate the sequential circuits with the delay enabled and without timing failures when the operating frequency is below the frequency threshold.

In Example 18, the disabling the delay of any one or more of Examples 1-17 optionally includes interrupting a fixed command signal configured by a locate critical path mechanism of a functional unit block of the first core during post-production testing of the multiple-core processor.

In Example 19, after operating the plurality of sequential circuit devices in a second non-test mode, the method of any one or more of Examples 1-18 optionally includes commanding a rise in the supply voltage of the plurality of sequential circuits to a third voltage level above a voltage threshold, enabling the delay of the clock signal after the supply voltage of the plurality of sequential circuits is above the voltage threshold, and commanding a rise in the operating frequency of the plurality of sequential circuits to a third clock frequency after the delay of the clock signal is enabled, wherein the third clock frequency is higher than the frequency threshold.

In Example 20, the enabling and disabling the delay of the clock signal of any one or more of Examples 1-19 optionally includes enabling and disabling a delay element of a regional clock buffer of a functional unit block of the first core using a power management controller of the multiple-core processor.

Each of these non-limiting examples can stand on its own, or can be combined with one or more of the other examples in any permutation or combination.

Example 21 can include, or can optionally be combined with any portion or combination of any portions of any one or more of Examples 1 through 20 to include, subject matter that can include means for performing any one or more of the functions of Examples 1 through 20, or a machine-readable medium including instructions that, when performed by a machine, cause the machine to perform any one or more of the functions of Examples 1 through 20

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are legally entitled.

What is claimed is:

1. An apparatus comprising:
   a plurality of clock buffers, each clock buffer of the plurality of clock buffers configured to receive a first clock signal and distribute a plurality of second clock signals;
   a one-time programmable locate critical path mechanism for investigating root causes for timing limiters of a processor and configured to provide a plurality of indications to enable or disable a first delay of each clock buffer of the plurality of clock buffers;
   a power management control circuit configured to command frequency changes of the first clock signal, to over-ride one or more of the plurality of indications in a first non-test mode of operation of the apparatus and to not over-ride the one or more indications in a second non-test mode of operation of the apparatus;
   wherein the first non-test mode is defined by a first supply voltage of the apparatus and a first frequency of the first clock signal commanded by the power management control circuit; and
   wherein the second non-test mode is defined by a second supply voltage of the apparatus and a second frequency of the first clock signal commanded by the power management control circuit.

2. The apparatus of claim 1, wherein the one-time programmable locate critical path mechanism is programmed during a test mode of the apparatus.

3. The apparatus of claim 1, including a plurality of delay controller circuits, each delay control circuit configured to receive one indication of the plurality of indications and an output of the power management control circuit, and to control one or more delay elements of the plurality of clock buffers based on the one indication and the output of the power management control circuit.

4. The apparatus of claim 3, wherein the power management control circuit is configured to receive a representation of the supply voltage of the apparatus and a representation of the frequency of the first clock signal, and to provide control information to the plurality of delay controller circuits as the output of the power management control circuit.

5. The apparatus of claim 4, wherein the power management control circuit includes a first voltage threshold and a first frequency threshold.

6. The apparatus of claim 5, wherein during a transition from the first mode to the second mode, the apparatus is configured to transition an operating frequency of the apparatus, a first transition of the operating frequency, from the first frequency to the second frequency before transitioning a supply voltage of the apparatus, a first transition of the supply voltage, from the first supply voltage to the second supply voltage, wherein the first frequency is higher than the second frequency.

7. The apparatus of claim 4, wherein the power management control circuit is configured to detect the first transition of the operating frequency, and to provide first command information to the one or more delay elements before the first transition of the supply voltage.

8. The apparatus of claim 7, wherein the one or more delay elements are configured to provide a second delay in response to the first command information.

9. The apparatus of claim 8, wherein the second delay is equivalent to bypassing the one or more delay elements.

10. The apparatus of claim 7, wherein, during a transition from the second mode to the first mode, the apparatus is configured to transition a supply voltage of the apparatus, a second transition of the supply voltage, from the second supply voltage to the first supply voltage before transitioning an operating frequency of the apparatus, a second transition of the operating frequency, from the second frequency to the first frequency.

11. The apparatus of claim 10, wherein the controller is configured to detect the second transition of the supply voltage and to provide second command information to the one or more delay elements before the second transition of the operating frequency.

12. The apparatus of claim 1, wherein the apparatus is a multiple-core processor, and
   wherein a first core of the multiple-core processor includes the plurality of clock buffers and the one-time programmable locate critical path mechanism.

13. A method for operating a multiple-core processor, the method comprising:
   enabling a delay of a clock signal of a plurality of sequential circuit devices of a first core of the multiple-core processor when a first supply voltage of the plurality of sequential circuit devices is above a threshold;
   operating the plurality of sequential circuit devices of the first core in a first non-test mode using the first supply voltage and a first clock frequency; commanding a drop in operating frequency of the plurality of sequential circuit devices from the first clock frequency to a second clock frequency using a power management controller of the first core;

disabling the delay of the clock signal when the operating frequency is below a frequency threshold; and operating the plurality of sequential circuit devices in a second non-test mode using the second clock frequency, wherein the second clock frequency is lower than the first clock frequency, wherein disabling the delay includes interrupting a fixed command signal configured by a locate critical path mechanism of a functional unit block for investigating root causes for timing limiters of the first core during post-production testing of the multiple-core processor.

14. The method of claim 13, wherein disabling the delay includes disabling the delay of the clock signal when the operating frequency is below a frequency threshold using an output of the power management controller.

15. The method of claim 13, including commanding a drop in a supply voltage of the plurality of sequential circuits from the first supply voltage to a second supply voltage after the delay is disable.

16. The method of claim 15, wherein the first supply voltage is above a voltage threshold, the voltage threshold indicative of a minimum supply voltage configured to operate the sequential circuits with the delay enabled and without timing failures when the operating frequency is below the frequency threshold.

17. The method of claim 13, wherein, after operating the plurality of sequential circuit devices in a second non-test mode, the method includes:

commanding a rise in the supply voltage of the plurality of sequential circuits to a third voltage level above a voltage threshold;

enabling the delay of the clock signal after the supply voltage of the plurality of sequential circuits is above the voltage threshold; and commanding a rise in the operating frequency of the plurality of sequential circuits to a third clock frequency after the delay of the clock signal is enabled, wherein the third clock frequency is higher than the frequency threshold.

18. The method of claim 17, wherein enabling and disabling the delay of the clock signal includes enabling and disabling a delay element of a regional clock buffer of a functional unit block of the first core using a power management controller of the multiple-core processor.

* * * * *